United States Patent
Azuma et al.

(10) Patent No.: US 8,765,002 B2
(45) Date of Patent: Jul. 1, 2014

(54) SUBSTRATE PROCESSING APPARATUS AND SUBSTRATE PROCESSING METHOD

(75) Inventors: Tomoyuki Azuma, Tokyo (JP); Kenji Yamada, Tokyo (JP); Hiroyuki Araki, Kyoto (JP); Koji Ando, Kyoto (JP)

(73) Assignees: Mitsubishi Gas Chemical Company, Inc. (JP); Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/409,879

(22) Filed: Mar. 1, 2012

(65) Prior Publication Data

US 2012/0223054 A1    Sep. 6, 2012

(30) Foreign Application Priority Data

Mar. 4, 2011 (JP) .................................. 2011-048113

(51) Int. Cl.
C03C 15/00 (2006.01)

(52) U.S. Cl.
USPC ............. 216/104; 216/37; 438/710; 438/745; 134/34; 134/184

(58) Field of Classification Search
USPC ........ 216/37, 104; 438/710, 745; 134/34, 184
See application file for complete search history.

(56) References Cited

U.S. PATENT DOCUMENTS

| | | | |
|---|---|---|---|
| 5,574,276 A | 11/1996 | Ishimaru | 250/222.2 |
| 6,077,321 A | 6/2000 | Adachi et al. | 29/25.01 |
| 6,716,365 B2 * | 4/2004 | Sakaida et al. | 216/90 |
| 8,019,467 B2 * | 9/2011 | Hongkham et al. | 700/228 |
| 8,110,508 B2 * | 2/2012 | Kang et al. | 438/745 |
| 2003/0019578 A1 | 1/2003 | Iwata et al. | 156/345.22 |
| 2003/0038115 A1 | 2/2003 | Sakaida et al. | 216/83 |
| 2005/0115671 A1 | 6/2005 | Araki | 156/345.12 |
| 2006/0151008 A1 | 7/2006 | Takushima | |
| 2007/0207706 A1 | 9/2007 | Takahashi | 451/28 |
| 2007/0212816 A1 | 9/2007 | Nishimura | 438/109 |
| 2008/0271752 A1 | 11/2008 | Takushima | |
| 2009/0035103 A1 | 2/2009 | Jo et al. | 414/222.13 |
| 2009/0275201 A1 | 11/2009 | Nishimura | 438/694 |
| 2010/0190286 A1 | 7/2010 | Kohira et al. | 438/57 |
| 2010/0255626 A1 | 10/2010 | Murai et al. | |
| 2010/0304570 A1 * | 12/2010 | Horie et al. | 438/710 |

FOREIGN PATENT DOCUMENTS

| | | | |
|---|---|---|---|
| CN | 1400635 A | 3/2003 | |
| CN | 1624871 A | 6/2005 | |
| CN | 101030528 A | 9/2007 | |
| CN | 101034662 A | 9/2007 | |
| EP | 2 224 471 A1 | 9/2010 | |
| JP | 5-36661 | 2/1993 | |
| JP | 10-050789 | 2/1998 | |

(Continued)

Primary Examiner — Lan Vinh
Assistant Examiner — Maki Angadi
(74) Attorney, Agent, or Firm — Ostrolenk Faber LLP

(57) ABSTRACT

A substrate processing apparatus includes a first processing chamber and a second processing chamber, a first substrate holding unit that holds a substrate in the first processing chamber, a chemical solution supply unit that supplies a chemical solution containing an etching component and a thickening agent to the substrate held by the first substrate holding unit, a substrate transfer unit that transfers the substrate from the first processing chamber to the second processing chamber in a state in which the chemical solution is held on the substrate, and a second substrate holding unit that holds a plurality of substrates on each of which the chemical solution is held in the second processing chamber.

8 Claims, 9 Drawing Sheets

(56) References Cited

FOREIGN PATENT DOCUMENTS

| | | |
|---|---|---|
| JP | 10-163289 | 6/1998 |
| JP | 10-335284 | 12/1998 |
| JP | 2005-44866 | 2/2005 |
| JP | 10-2005-0119177 | 12/2005 |
| JP | 2007-142077 | 6/2007 |
| JP | 2007-318016 | 12/2007 |
| JP | 2009-536784 | 10/2009 |
| KR | 10-2007-0092152 | 9/2007 |
| KR | 10-2010-0093024 | 8/2010 |
| TW | 283204 | 8/1996 |
| TW | 200731382 A | 8/2007 |
| TW | 200908191 A | 2/2009 |
| WO | WO 2006/116770 A2 | 11/2006 |

* cited by examiner

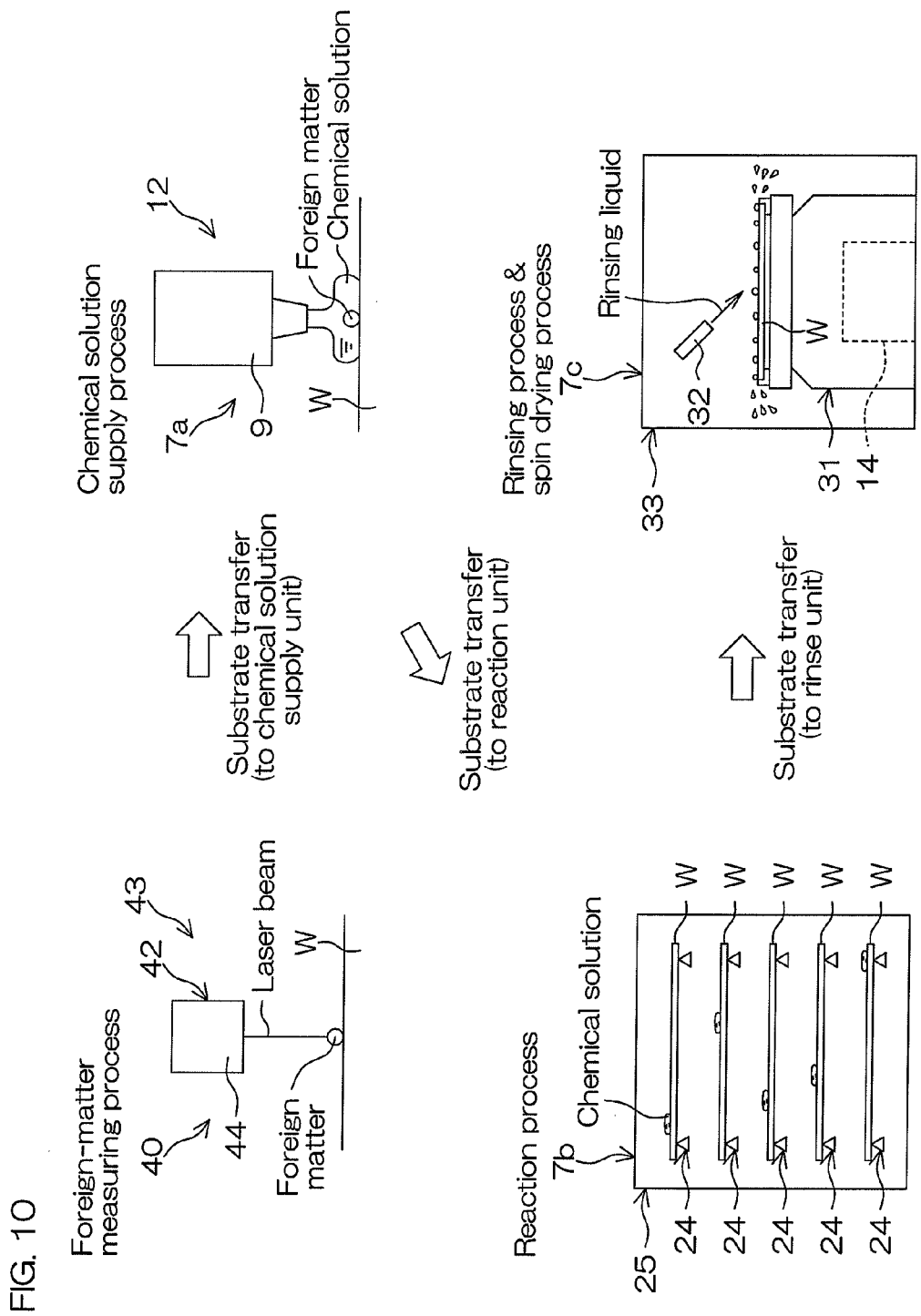

SUBSTRATE PROCESSING APPARATUS AND SUBSTRATE PROCESSING METHOD

BACKGROUND OF THE INVENTION

1. Field of the Invention

This invention relates to a substrate processing apparatus and a substrate processing method for processing substrates. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

A substrate, such as a semiconductor wafer or a glass substrate for a liquid crystal display device, is processed by use of a processing liquid in a production process in which a semiconductor device, a liquid crystal display device, or the like is produced.

For example, Japanese Published Unexamined Patent Application No. 2007-318016 discloses a substrate processing apparatus of the single-substrate processing type that performs bevel etching. This substrate processing apparatus includes a spin chuck that horizontally holds and rotates a substrate around a vertical axis and a lower-surface nozzle that faces the central portion of a lower surface of the substrate held by the spin chuck. A chemical solution discharged from the lower-surface nozzle is supplied to the central portion of the lower surface of the substrate being rotated. Thereafter, the chemical solution supplied thereto spreads outwardly along the lower surface of the substrate by the rotation of the substrate, and turns to the peripheral portion of an upper surface of the substrate while proceeding along the peripheral end surface of the substrate. As a result, the chemical solution is supplied to the whole area of the peripheral portion of the upper surface of the substrate.

Likewise, Japanese Published Unexamined Patent Application No. 2007-142077 discloses a substrate processing apparatus of the single-substrate processing type that performs bevel etching. This substrate processing apparatus includes a spin chuck that horizontally holds and rotates a substrate around a vertical axis and a peripheral-portion processing nozzle that faces the peripheral portion of an upper surface of the substrate held by the spin chuck. A chemical solution discharged from the peripheral-portion processing nozzle is supplied to the peripheral portion of the upper surface of the substrate being rotated. As a result, the chemical solution is supplied to the whole area of the peripheral portion of the upper surface of the substrate.

Additionally, U.S. Patent Application Publication No. 2006/0151008 A1 discloses a cleaning method for cleaning a substrate by use of a highly viscous liquid. In this cleaning method, a highly viscous liquid is supplied to an upper surface of a substrate. Thereafter, the substrate starts being rotated. The liquid supplied thereto moves outwardly on the substrate by the rotation of the substrate. As a result, the highly viscous liquid is discharged from the substrate. Foreign matters adhering to the upper surface of the substrate are discharged from the substrate along with the highly viscous liquid. As a result, the foreign matters are removed from the substrate.

In the substrate processing apparatuses of Japanese Published Unexamined Patent Application Nos. 2007-318016 and 2007-142077, a chemical solution supplied to the peripheral portion of the upper surface of the substrate is discharged outwardly by the rotation of the substrate. Therefore, the chemical solution is required to be discharged from the nozzle during the processing of the substrate by use of the chemical solution. Therefore, a state in which the peripheral portion of the upper surface of the substrate and the chemical solution are in contact with each other is maintained, and the chemical solution that has a sufficient processing capability continues being supplied to the peripheral portion of the upper surface of the substrate. However, the consumption of the chemical solution will be increased if the chemical solution continues being discharged from the nozzle.

On the other hand, in the cleaning method of U.S. Patent Application Publication No. 2006/0151008 A1, a highly viscous liquid is supplied to an upper surface of a substrate. The liquid is high in viscosity, and hence can be held on the substrate. Therefore, a state in which the substrate and the liquid are in contact with each other can be maintained even if a highly viscous liquid does not continue being supplied to the substrate. Therefore, the consumption of the liquid can be reduced. However, in this cleaning method, foreign matters cannot be sometimes removed from the substrate if adhesion of the foreign matters to the upper surface of the substrate is extremely firm.

In order to reduce the consumption of a chemical solution and to reliably remove foreign matters from a substrate, it is possible to, for example, employ a method for supplying the substrate with a highly viscous chemical solution capable of dissolving the substrate. According to this method, the substrate can be allowed to hold the chemical solution because the chemical solution has high viscosity. Therefore, the consumption of the chemical solution can be reduced. Additionally, foreign matters adhering to the substrate can be lifted off from the substrate along with a portion of the substrate by allowing the substrate and the chemical solution to react together and hence dissolving the portion of the substrate. Therefore, the foreign matters can be reliably removed from the substrate.

However, in this method, the chemical solution contiguous to the substrate is not replaced by a new chemical solution, and therefore there is a case in which much time is consumed to allow the substrate and the chemical solution to sufficiently react together, and hence a satisfactory processing speed cannot be secured. It is conceivable that the substrate is located at that place (i.e., the position to which the chemical solution has been supplied) until the substrate and the chemical solution sufficiently react together, and, if so, a highly viscous chemical solution cannot be supplied to a subsequent substrate until the substrate to which the chemical solution has been supplied is taken out. Therefore, throughput (i.e., the number of substrates processed per unit time) will be decreased.

It is therefore an object of the present invention to provide a substrate processing apparatus and a substrate processing method that are capable of reducing the consumption of a chemical solution and capable of restraining or preventing a decrease in throughput.

SUMMARY OF THE INVENTION

One embodiment of the present invention provides a substrate processing apparatus including a first processing chamber and a second processing chamber, a first substrate holding unit that holds a substrate in the first processing chamber, a chemical solution supply unit that supplies a chemical solution containing an etching component and a thickening agent to the substrate held by the first substrate holding unit, a substrate transfer unit that transfers the substrate from the first processing chamber to the second processing chamber in a state in which the chemical solution is held on the substrate, and a second substrate holding unit that holds a plurality of substrates on each of which the chemical solution is held in the second processing chamber.

According to this structure, a chemical solution containing an etching component and a thickening agent is supplied to a substrate held by the first substrate holding unit in the first processing chamber. Thereafter, the substrate is transferred by the substrate transfer unit from the first processing chamber to the second processing chamber in a state in which the chemical solution is held on the substrate. This operation is repeatedly performed, and a plurality of substrates on each of which the chemical solution is held are carried into the second processing chamber. The substrates carried into the second processing chamber are held by the second substrate holding unit in a state of holding the chemical solution. The substrates held by the second substrate holding unit are carried out of the second processing chamber in order of arrival of a stay time in the second processing chamber at a predetermined time. The substrates are processed without hindrance in this way.

The viscosity of a chemical solution supplied to the substrate is increased by adding a thickening agent. In other words, the flowability of a chemical solution is lowered by adding a thickening agent. Therefore, a state in which the substrate is covered with a chemical solution is maintained even if the chemical solution does not continue being supplied to the substrate. Therefore, the consumption of the chemical solution can be reduced. Additionally, an etching component is contained in the chemical solution, and therefore foreign matters, such as particles, adhering to a substrate can be lifted off from the substrate along with a portion of the substrate, or foreign matters can be removed from the substrate by being dissolved by the etching component. As a result, such foreign matters can be reliably removed from the substrate.

As mentioned above, the substrate to which the chemical solution has been supplied in the first processing chamber is transferred from the first processing chamber to the second processing chamber in a state of holding the chemical solution, and is held in the second processing chamber during a predetermined time in a state of holding the chemical solution. Therefore, a period of time during which the substrate and the chemical solution react to each other is secured sufficiently. Additionally, the reaction of the substrate and the chemical solution to each other is also performed outside the first processing chamber, and therefore the chemical solution can be supplied to a subsequent substrate in the first processing chamber during the progression of the reaction of the substrate and the chemical solution to each other. Therefore, a decrease in throughput (i.e., the number of substrates to be processed per unit time) can be restrained or prevented.

The substrate processing apparatus may further include a third processing chamber, a third substrate holding unit that holds a substrate in the third processing chamber, and a rinsing liquid supply unit that supplies a rinsing liquid to a substrate held by the third substrate holding unit. In this case, the substrate transfer unit may be arranged to transfer a substrate from the second processing chamber to the third processing chamber.

According to this structure, a substrate held in the second processing chamber during a predetermined time is transferred by the substrate transfer unit from the second processing chamber to the third processing chamber. In other words, a substrate that has satisfactorily reacted to a chemical solution in the second processing chamber is carried into the third processing chamber. Thereafter, a rinsing liquid is supplied to the substrate held by the third substrate holding unit in the third processing chamber. As a result, the chemical solution held on the substrate is rinsed away by the rinsing liquid. As mentioned above, the supply of the chemical solution, the reaction of the substrate and the chemical solution to each other, and the removal of the chemical solution are performed in the different processing chambers, respectively, and therefore the structure in each of the processing chambers can be prevented from being complicated.

The chemical solution supply unit may be arranged to supply the chemical solution to the whole area of the major surface of the substrate held by the first substrate holding unit. The chemical solution supply unit may be arranged to partially supply the chemical solution to the major surface of the substrate held by the first substrate holding unit. If the substrate is a substrate (for example, a bare wafer) that does not have a thin film on its surface layer, the major surface of the substrate is a surface of the substrate itself. If the substrate is a substrate that has a thin film on its surface layer, the major surface of the substrate may be an outer surface of the thin film, or may be an outer surface of the bed of the thin film. When the chemical solution is partially supplied to the major surface of the substrate, the consumption of the chemical solution can be made smaller than when the chemical solution is supplied to the whole area of the major surface of the substrate.

If the chemical solution is partially supplied to the major surface of the substrate, the region into which the chemical solution is supplied may be a region determined for each substrate. Specifically, the substrate processing apparatus may further include a foreign-matter measuring unit that measures a position of foreign matters adhering to the major surface of the substrate, and the chemical solution supply unit may be arranged to supply the chemical solution into a region in which foreign matters are contained in the major surface. According to this structure, the chemical solution is reliably supplied into the region in which foreign matters are contained, and therefore the foreign matters adhering to the substrate can be reliably removed. Additionally, the chemical solution is supplied only into the region in which foreign matters are contained, and therefore the chemical solution can be restrained or prevented from being supplied into a region that has no need for the supply of the chemical solution. Therefore, the region that has no need for the supply of the chemical solution can be restrained or prevented from being affected by the chemical solution.

When the position of foreign matters adhering to the major surface of the substrate is measured by the foreign-matter measuring unit, the foreign matters may be measured in any one of the first, second, and third processing chambers, or may be measured in a place differing from these processing chambers. Specifically, the substrate processing apparatus may further include a measuring chamber in which the position of foreign matters adhering to the substrate is measured by the foreign-matter measuring unit, and the substrate transfer unit may be arranged to transfer the substrate from the measuring chamber to the first processing chamber. According to this structure, foreign matters are measured by the foreign-matter measuring unit in a place differing from the first, second, and third processing chambers, and therefore the structure in each of the processing chambers can be restrained or prevented from being complicated.

When a chemical solution is partially supplied to the major surface of the substrate, the region into which the chemical solution is supplied may be a predetermined region. Specifically, the chemical solution supply unit may be arranged to supply the chemical solution into a predetermined region of the major surface. The predetermined region of the major surface may be a peripheral portion of the major surface. According to this structure, the region into which the chemical solution is supplied is predetermined, and therefore the position to which the chemical solution is supplied is not required to be changed for each substrate.

Another embodiment of the present invention provides a substrate processing method including a chemical solution supply step of supplying a chemical solution containing an etching component and a thickening agent to a substrate and allowing the substrate to hold the chemical solution, a transfer step of transferring the substrate in a state in which the chemical solution is held on the substrate after the chemical solution supply step is performed, and a reaction processing step of promoting a reaction of the substrate on which the chemical solution is held and the chemical solution to each other after the transfer step is performed. The etching component may be a mixture of hydrofluoric acid and hydrogen peroxide or a mixture of ammonium hydroxide and hydrogen peroxide. The thickening agent may be one or more selected from methylcellulose, carboxymethyl cellulose, polyethylene glycol, sodium polyacrylate, and polyvinyl alcohol. According to this method, the same effect as the above-mentioned effect can be fulfilled.

The aforementioned or other objects, features, and effects of the present invention will be clarified by the following description of embodiments given below with reference to the accompanying drawings.

BRIEF DESCRIPTION OF THE DRAWINGS

FIG. 10 is a view for describing one example of substrate processing performed by the substrate processing apparatus according to the second embodiment of the present invention.

DETAILED DESCRIPTION OF PREFERRED EMBODIMENTS

First Embodiment

Figure 1:
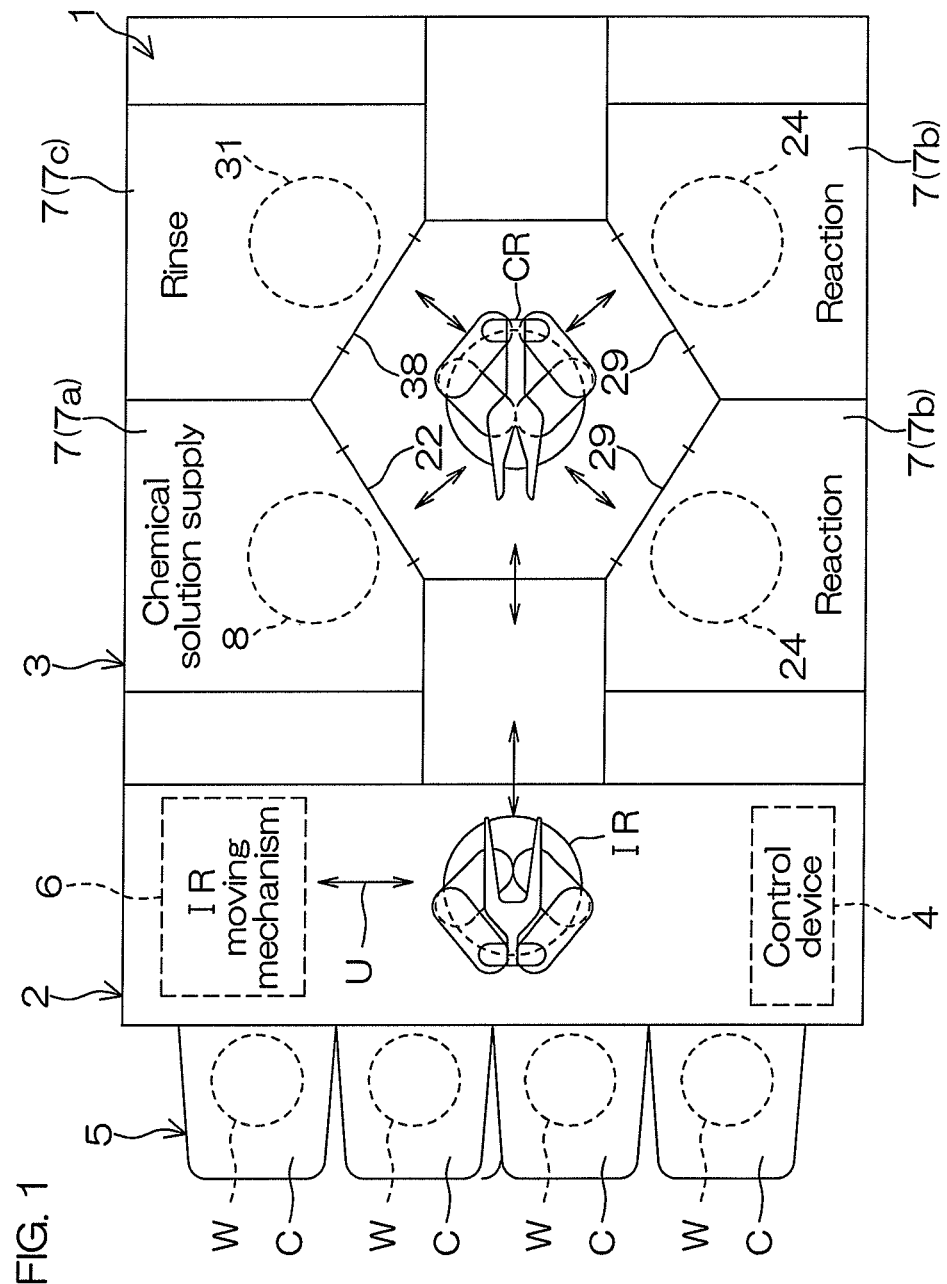
FIG. 1 is a illustrated plan view showing a layout of a substrate processing apparatus according to a first embodiment of the present invention.

FIG. 1 is a illustrated plan view showing a layout of a substrate processing apparatus 1 according to a first embodiment of the present invention.

The substrate processing apparatus 1 is a substrate processing apparatus of the single-substrate processing type that processes circular substrates W, such as semiconductor wafers, one by one by use of a processing liquid, such as a chemical solution or a rinsing liquid. The substrate processing apparatus 1 includes an indexer block 2, a processing block 3 joined to the indexer block 2, and a control device 4 that controls the operation of devices provided in the substrate processing apparatus 1 or controls the opening and closing of valves.

The indexer block 2 includes a carrier holding section 5, an indexer robot IR (substrate transfer unit), and an IR moving mechanism 6. The carrier holding section 5 holds carriers C that can contain a plurality of substrates W. The carriers C are held by the carrier holding section 5 in a state of being arranged in a horizontal carrier array direction U. The IR moving mechanism 6 moves the indexer robot IR in the carrier array direction U. The indexer robot IR performs a carry-in operation for carrying a substrate W into the carrier C held by the carrier holding section 5 and a carry-out operation for carrying a substrate W out of the carrier C. The substrate W is transferred by the indexer robot IR in a horizontal posture.

On the other hand, the processing block 3 includes a plurality of (for example, four or more) processing units 7 that process substrates W and a center robot CR (a substrate transfer unit). The processing units 7 are arranged so as to surround the center robot CR when viewed planarly. The processing units 7 include a chemical solution supply unit 7a that supplies a chemical solution to a substrate W, a reaction unit 7b that promotes a reaction of the substrate W and the chemical solution to each other, and a rinse unit 7c that rinses away the chemical solution supplied to the substrate W. The center robot CR performs a carry-in operation for carrying substrates W into the processing unit 7 and a carry-out operation for carrying substrates W out of the processing unit 7. In addition, the center robot CR transfers substrates W between the processing units 7. Each substrate W is transferred by the center robot CR in a horizontal posture. The center robot CR receives substrates W from the indexer robot IR, and delivers substrates W to the indexer robot IR.

Figure 2:
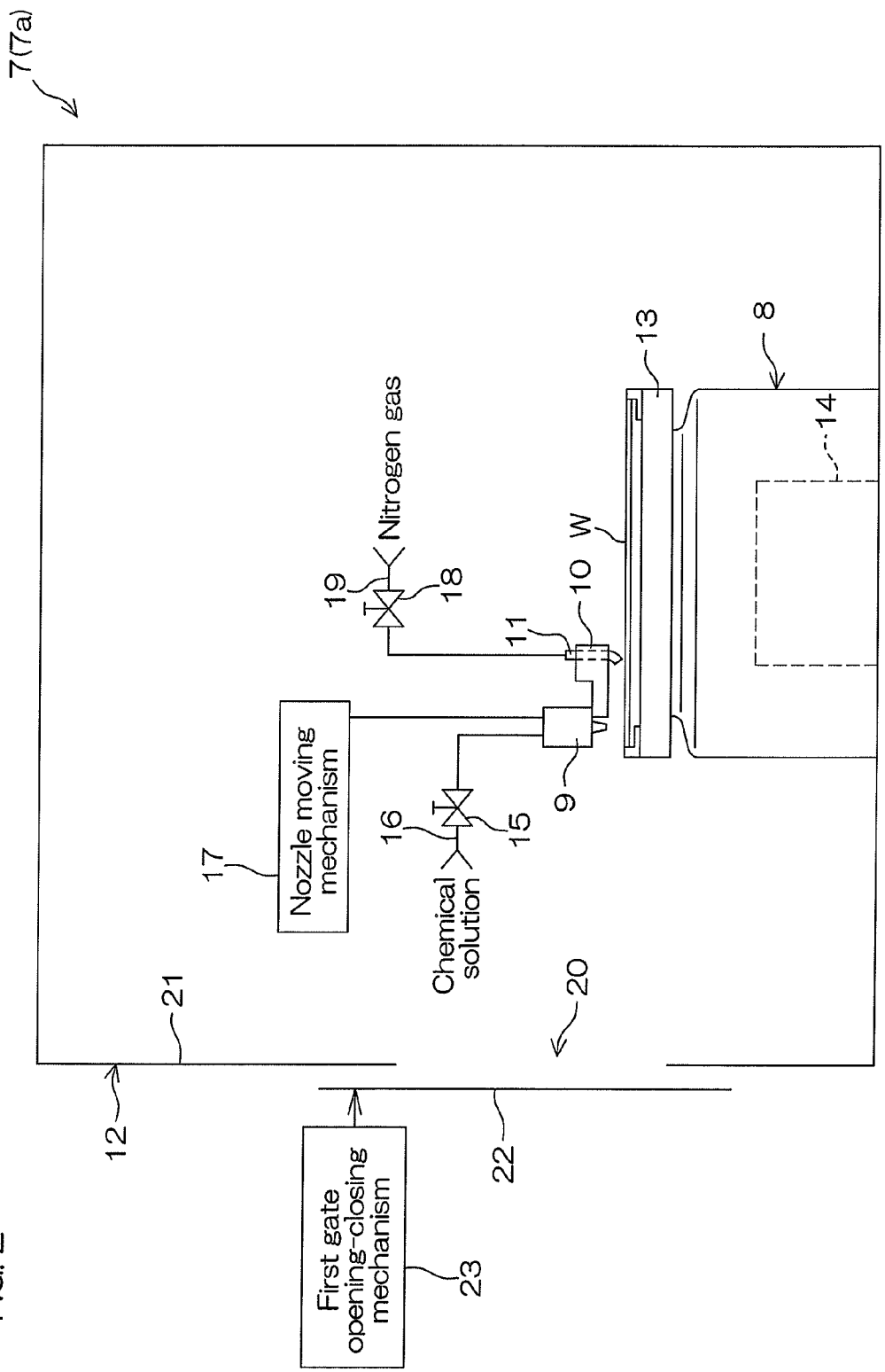
FIG. 2 is a schematic view showing a structure of a chemical solution supply unit according to the first embodiment of the present invention.
Figure 3:
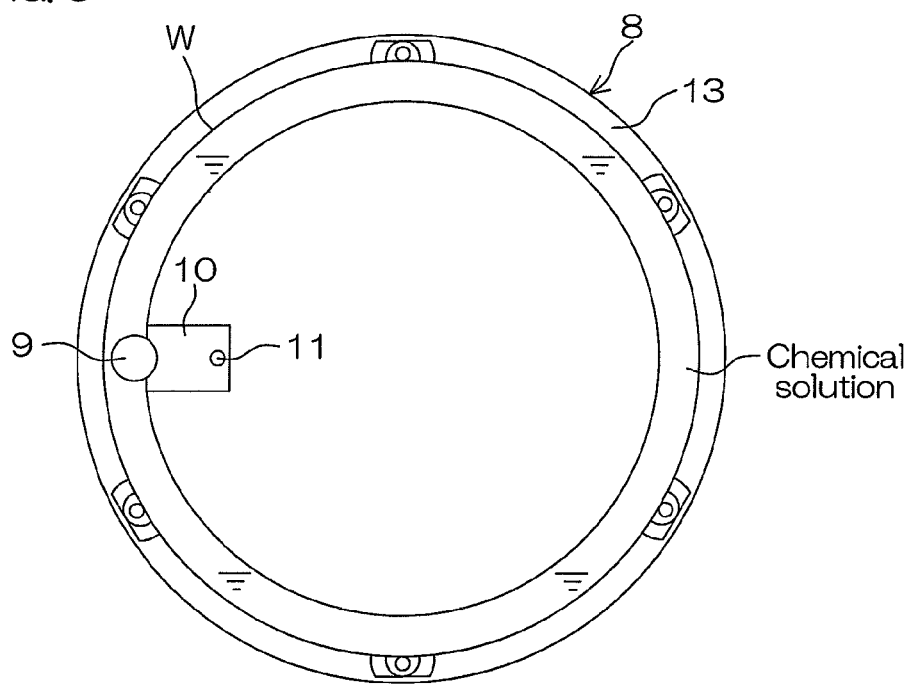
FIG. 3 is a plan view of a chemical solution nozzle and a structure relative to this nozzle according to the first embodiment of the present invention.
Figure 4:
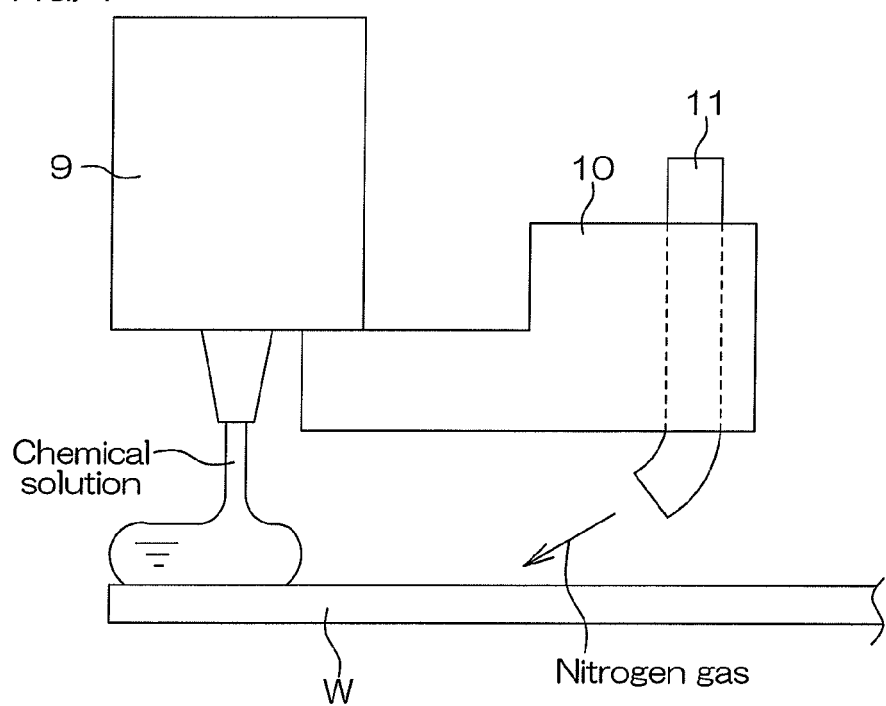
FIG. 4 is a side view of the chemical solution nozzle and the structure relative to this nozzle according to the first embodiment of the present invention.

FIG. 2 is a schematic view showing a structure of a chemical solution supply unit 7a according to the first embodiment of the present invention. FIG. 3 is a plan view of a chemical solution nozzle 9 and a structure relative to this nozzle according to the first embodiment of the present invention. FIG. 4 is a side view of the chemical solution nozzle 9 and the structure relative to this nozzle according to the first embodiment of the present invention.

The chemical solution supply unit 7a includes a first spin chuck 8 (first substrate holding unit) that horizontally holds and rotates a substrate W, a chemical solution nozzle 9 (chemical solution supply unit) that supplies a chemical solution to the upper surface of a substrate W held by the first spin chuck 8, a covering member 10 disposed near the upper surface of a substrate W held by the first spin chuck 8, a nitrogen gas nozzle 11 that supplies nitrogen gas between a substrate W and the covering member 10, and a first chamber 12 (first processing chamber) that contains the first spin chuck 8, the chemical solution nozzle 9, the covering member 10, and the nitrogen gas nozzle 11.

The first spin chuck 8 includes a disk-shaped spin base 13 that is rotatable around a vertical axis passing through the center of a substrate W while horizontally holding the substrate W and a spin motor 14 that rotates the spin base 13 around the vertical axis. The first spin chuck 8 may be a gripping-type chuck that grips a substrate W in a horizontal direction and holds the substrate W horizontally, or may be a vacuum-type chuck that horizontally holds a substrate W by sucking a rear surface (lower surface), which is a non-device forming surface, of the substrate W. In the first embodiment, the first spin chuck 8 is a gripping-type chuck.

The chemical solution nozzle 9 is connected to a chemical solution supply pipe 16 with a chemical solution valve 15 interposed therein. The supply of a chemical solution to the chemical solution nozzle 9 is controlled by opening and closing the chemical solution valve 15. A nozzle moving mechanism 17 moves the chemical solution nozzle 9 between a processing position (shown in FIG. 2 to FIG. 4) and a waiting position. The processing position is a position at which a chemical solution discharged from the chemical solution nozzle 9 is supplied to the upper surface of a substrate W held by the first spin chuck 8, and the waiting position is a position away from the first spin chuck 8. The processing position of the chemical solution nozzle 9 in the first embodiment is a predetermined position at which a chemical solution discharged from the chemical solution nozzle 9 is supplied to the peripheral portion of the upper surface of a substrate W. Without being limited to the predetermined position, the processing position of the chemical solution nozzle 9 may include a plurality of positions at which a chemical solution discharged from the chemical solution nozzle 9 is supplied to the upper surface of a substrate W. In other words, the processing position of the chemical solution nozzle 9 may be a predetermined region in which a chemical solution discharged from the chemical solution nozzle 9 is supplied to any one of a plurality of positions on the upper surface of a substrate W.

The chemical solution supplied to the chemical solution nozzle 9 is a highly viscous etchant whose viscosity has been adjusted by a thickening agent. The viscosity of the chemical solution is adjusted so that the chemical solution stays at a position on the substrate W, to which the chemical solution has been supplied, almost without moving from this position, for example, when the chemical solution is supplied to the upper surface of the substrate W rotating at a rotational speed of several hundred revolutions per minute (rpm) or less at room temperature (20° C. to 30° C.). A specific viscosity range of the chemical solution is 100 mPa·s to 100 Pa·s, preferably 1 to 70 Pa·s, and more preferably 3 to 50 Pa·s. The chemical solution contains an etching component and a thickening agent. The etching component is a liquid that dissolves a substrate W or foreign matters, such as particles, adhering to the substrate W. The substrate W mentioned here may be a substrate (for example, a bare wafer) that has no thin film on its surface layer, or may be a substrate that has a thin film on its surface layer. The etching component that dissolves a substrate W may be a component that dissolves the substrate itself (for example, bare wafer), or may be a component that dissolves a thin film formed on the surface layer of the substrate W. The thickening agent is mixed with the etching component. One example of the chemical solution is a mixture of a mixture of hydrofluoric acid and hydrogen peroxide or a mixture of ammonium hydroxide and hydrogen peroxide with at least one of methylcellulose, carboxymethyl cellulose, polyethylene glycol, sodium polyacrylate, and polyvinyl alcohol. Both the mixture of hydrofluoric acid and hydrogen peroxide and the mixture of ammonium hydroxide and hydrogen peroxide are one example of the etching component, and at least one of methylcellulose, carboxymethyl cellulose, polyethylene glycol, sodium polyacrylate, and polyvinyl alcohol is one example of the thickening agent.

The covering member 10 is large enough to cover at least one portion of the peripheral portion of the upper surface of the substrate W. The covering member 10 may be larger than the substrate W when viewed planarly, or may be smaller than the substrate W when viewed planarly. In the first embodiment, the covering member 10 is a plate-like member smaller than the substrate W when viewed planarly. The covering member 10 has a flat lower surface. A moving mechanism (not shown) moves the covering member 10 between a processing position (shown in FIG. 2 to FIG. 4) and a waiting position. The processing position is a position at which the lower surface of the covering member 10 is brought close to the upper surface of the substrate W and at which a portion of the peripheral portion of the upper surface of the substrate W is covered with the covering member 10. The waiting position is a position away from the first spin chuck 8. The processing position of the covering member 10 is disposed inside the processing position of the chemical solution nozzle 9 (in a direction approaching the rotational axis of the substrate W). The processing position of the covering member 10 and the processing position of the chemical solution nozzle 9 are near each other. Therefore, the covering member 10 is placed inside the chemical solution nozzle 9, and the chemical solution nozzle 9 and the covering member 10 are near each other in a state in which the chemical solution nozzle 9 and the covering member 10 are in their respective processing positions. The chemical solution nozzle 9 may be arranged to be held by the covering member 10 and be moved together with the covering member 10.

The nitrogen gas nozzle 11 is connected to a nitrogen gas supply pipe 19 with a nitrogen gas valve 18 interposed therein. The supply of nitrogen gas to the nitrogen gas nozzle 11 is controlled by opening and closing the nitrogen gas valve 18. The nitrogen gas nozzle 11 is held by the covering member 10. Therefore, the nitrogen gas nozzle 11 moves together with the covering member 10. The nitrogen gas nozzle 11 is arranged so that, when nitrogen gas is discharged in a state in which the covering member 10 is in the processing position, nitrogen gas discharged therefrom flows outwardly (in a direction receding from the rotational axis of the substrate W) between the lower surface of the covering member 10 and the upper surface of the substrate W. The nitrogen gas nozzle 11 may be held independently of the covering member 10 without being held by the covering member 10.

The first chamber 12 includes a first partition wall 21 having a first opening 20 and a first gate shutter 22 with which the first opening 20 is covered. The first gate shutter 22 is disposed outside the first partition wall 21. A first gate opening-closing mechanism 23 is connected to the first gate shutter 22. The first gate opening-closing mechanism 23 moves the first gate shutter 22 between a closed position at which the first opening 20 is closed by the first gate shutter 22 and an open position at which the first opening 20 is opened. The first gate shutter 22 is beforehand placed at the open position when the substrate W is carried into the first chamber 12 or when the substrate W is carried out of the first chamber 12. The substrate W is carried into and out of the first chamber 12 in a state in which the first opening 20 is opened. Thereafter, the first gate shutter 22 is placed at the closed position, and the first opening 20 is closed by the first gate shutter 22.

Figure 5:
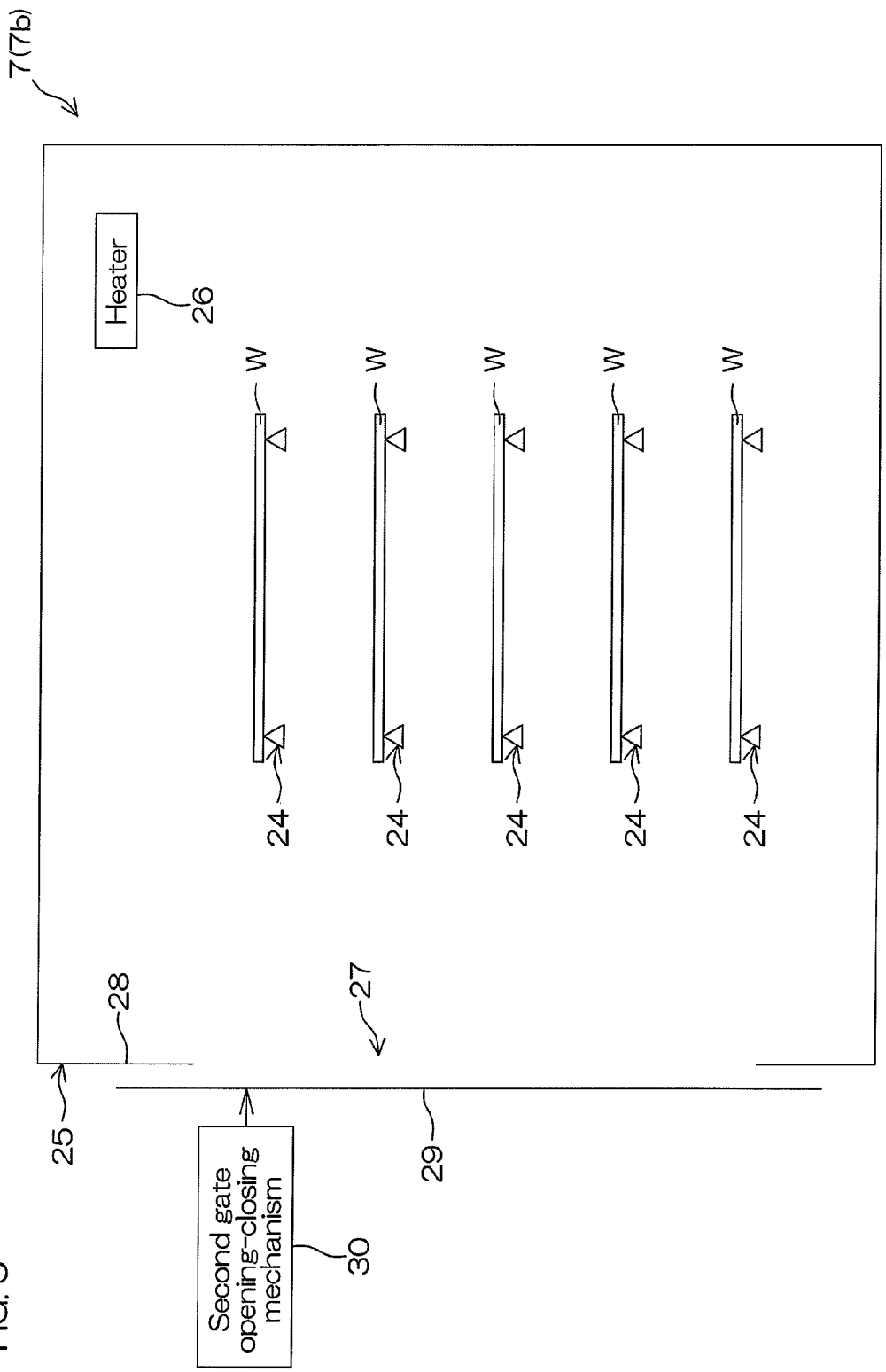
FIG. 5 is a schematic view showing a structure of a reaction unit according to the first embodiment of the present invention.

FIG. 5 is a schematic view showing a structure of the reaction unit 7b according to the first embodiment of the present invention.

The reaction unit 7b includes a plurality of substrate holding members 24 (second substrate holding unit) that horizontally hold substrates W, a second chamber 25 (second processing chamber) in which the substrate holding members 24 are contained, and a heater 26 that heats the inside of the second chamber 25.

The plurality of substrate holding members 24 are arranged to horizontally hold a plurality of substrates W, respectively. The substrate holding members 24 may hold the substrates W so that the substrates W are arrayed in an up-down direction in a horizontal posture, or may hold the substrates W so that the substrates W are arrayed in a horizontal direction in a horizontal posture. Additionally, the substrate holding members 24 may hold the substrates W by supporting the substrates W from below, or may hold the substrates W by horizontally gripping the substrates W. In other words, as long as the substrates W are horizontally held, the substrate holding members 24 do not have restrictions on how to hold the substrates W. The heat of the heater 26 is transmitted to the substrates W held by the substrate holding members 24. As a result, the substrates W are heated in the second chamber 25.

The second chamber 25 includes a second partition wall 28 having a second opening 27 and a second gate shutter 29 with which the second opening 27 is covered. The second gate shutter 29 is disposed outside the second partition wall 28. A second gate opening-closing mechanism 30 is connected to the second gate shutter 29. The second gate opening-closing mechanism 30 moves the second gate shutter 29 between a closed position at which the second opening 27 is closed by the second gate shutter 29 and an open position at which the second opening 27 is opened. The second gate shutter 29 is beforehand placed at the open position when the substrate W is carried into the second chamber 25 or when the substrate W is carried out of the second chamber 25. The substrate W is carried into and out of the second chamber 25 in a state in which the second opening 27 is opened. Thereafter, the second gate shutter 29 is placed at the closed position, and the second opening 27 is closed by the second gate shutter 29.

Figure 6:
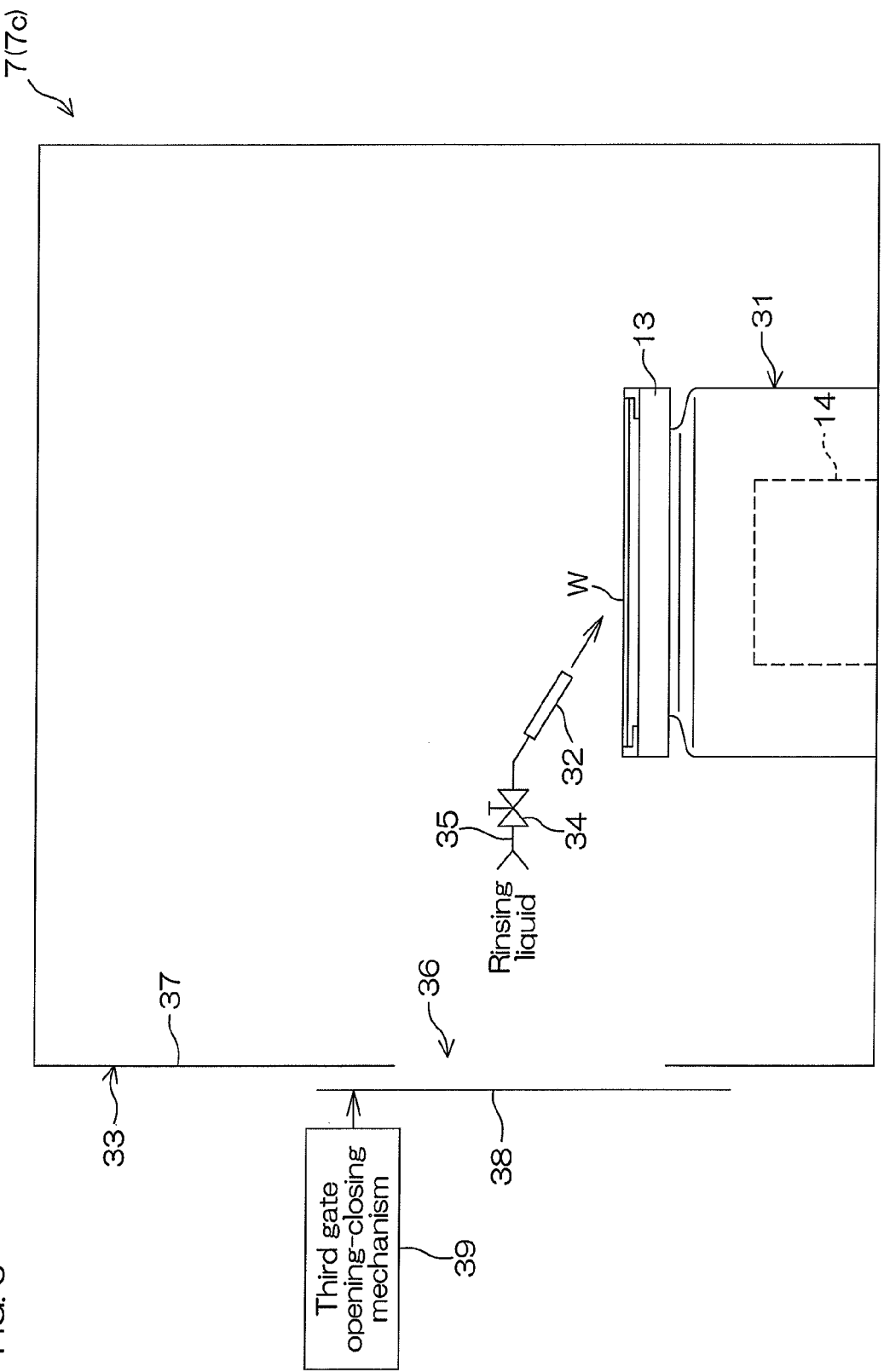
FIG. 6 is a schematic view showing a structure of a rinse unit according to the first embodiment of the present invention.

FIG. 6 is a schematic view showing a structure of the rinse unit 7c according to the first embodiment of the present invention.

The rinse unit 7c includes a third spin chuck 31 (third substrate holding unit) that horizontally holds and rotates a substrate W, a rinsing liquid nozzle 32 (rinsing liquid supply unit) that supplies a rinsing liquid to the upper surface of the substrate W held by the third spin chuck 31, and a third chamber 33 (third processing chamber) that contains the third spin chuck 31 and the rinsing liquid nozzle 32.

The third spin chuck 31 includes a disk-shaped spin base 13 that is rotatable around a vertical axis passing through the center of a substrate W while horizontally holding the substrate W and a spin motor 14 that rotates the spin base 13 around the vertical axis. The third spin chuck 31 may be a gripping-type chuck, or may be a vacuum-type chuck. In the first embodiment, the third spin chuck 31 is a gripping-type chuck.

The rinsing liquid nozzle 32 is connected to a rinsing liquid supply pipe 35 with a rinsing liquid valve 34 interposed therein. The supply of the rinsing liquid to the rinsing liquid nozzle 32 is controlled by opening and closing the rinsing liquid valve 34. A moving mechanism (not shown) moves the rinsing liquid nozzle 32 between a processing position (shown in FIG. 6) and a waiting position. The processing position is a position at which a rinsing liquid discharged from the rinsing liquid nozzle 32 is supplied to the central portion of the upper surface of a substrate W held by the third spin chuck 31, and the waiting position is a position away from the third spin chuck 31. Pure water (DIW: Deionized water), carbonated water, electrolyzed ion water, hydrogen water, ozone water, or aqueous hydrochloric acid of dilute concentration (e.g., about 10 to 100 ppm) can be mentioned as the rinsing liquid supplied to the rinsing liquid nozzle 32.

The third chamber 33 includes a third partition wall 37 having a third opening 36 and a third gate shutter 38 with which the third opening 36 is covered. The third gate shutter 38 is disposed outside the third partition wall 37. A third gate opening-closing mechanism 39 is connected to the third gate shutter 38. The third gate opening-closing mechanism 39 moves the third gate shutter 38 between a closed position at which the third opening 36 is closed by the third gate shutter 38 and an open position at which the third opening 36 is opened. The third gate shutter 38 is beforehand placed at the open position when the substrate W is carried into the third chamber 33 or when the substrate W is carried out of the third chamber 33. The substrate W is carried into and out of the third chamber 33 in a state in which the third opening 36 is opened. Thereafter, the third gate shutter 38 is placed at the closed position, and the third opening 36 is closed by the third gate shutter 38.

Figure 7:
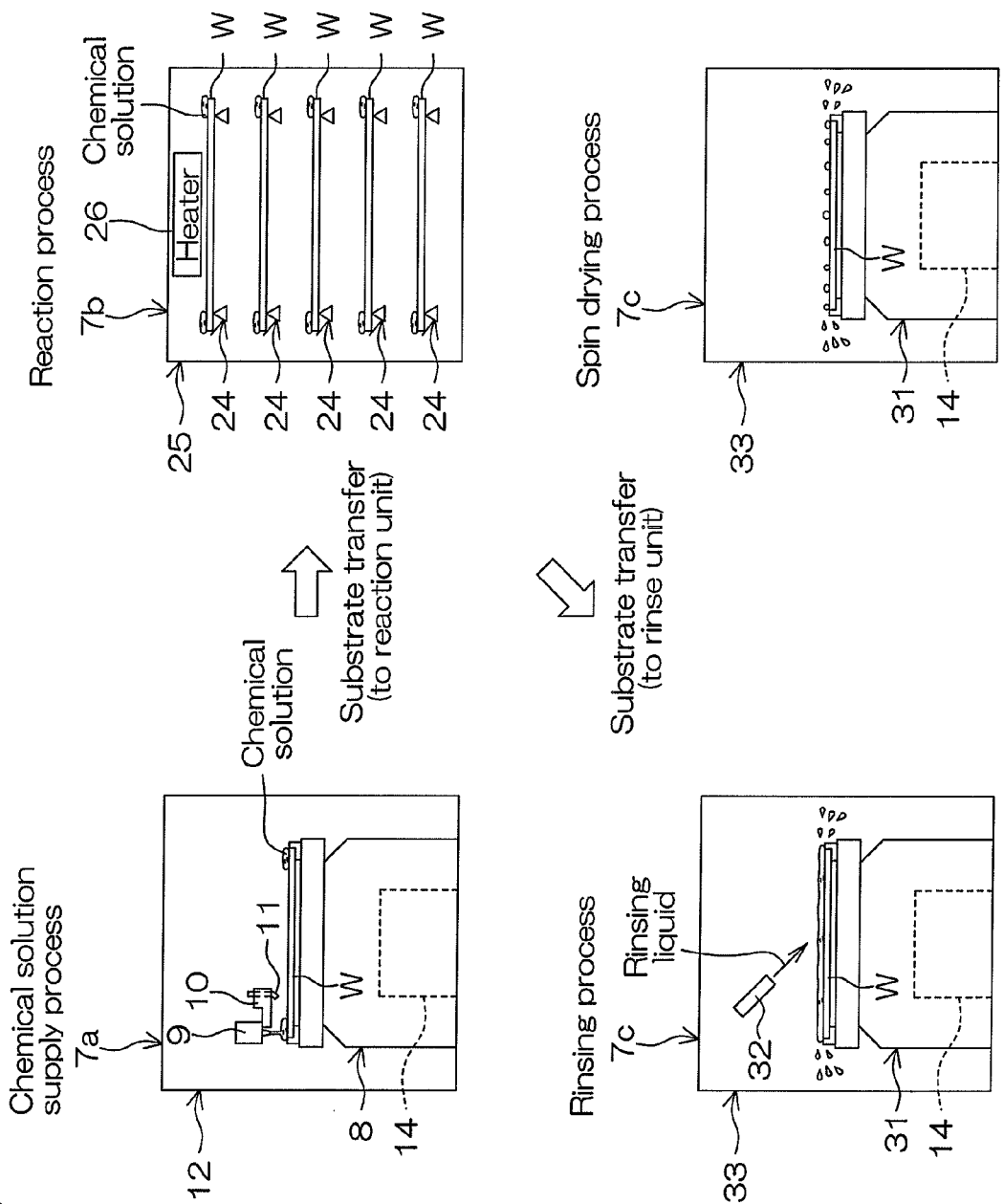
FIG. 7 is a view for describing one example of substrate processing performed by the substrate processing apparatus according to the first embodiment of the present invention.

FIG. 7 is a view for describing one example of processing the substrate W performed by the substrate processing apparatus 1 according to the first embodiment of the present invention. Hereinafter, reference is made to FIG. 1 and FIG. 7.

The control device 4 allows the indexer robot IR to carry out unprocessed substrates W contained in the carrier C. Thereafter, the control device 4 moves the substrates W carried out of the carrier C from the indexer robot IR to the center robot CR. Thereafter, the control device 4 allows the center robot CR to carry the substrate W delivered to the center robot CR into the chemical solution supply unit 7a. As a result, each substrate W is placed on the first spin chuck 8 as shown in FIG. 7. When the substrate W is placed on the first spin chuck 8, the control device 4 locates the chemical solution nozzle 9 and the covering member 10 at their respective waiting positions.

Thereafter, a chemical solution supply process in which a chemical solution is supplied to the peripheral portion of the upper surface of the substrate W is performed as shown in FIG. 7. Specifically, the control device 4 controls the spin motor 14 and allows the first spin chuck 8 to start the rotation of the substrate W. Thereafter, the control device 4 moves the chemical solution nozzle 9 and the covering member 10 to their respective processing positions. As a result, the chemical solution nozzle 9, the covering member 10, and the nitrogen gas nozzle 11 move above the peripheral portion of the upper surface of the substrate W, and the lower surface of the covering member 10 is brought close to the peripheral portion of the upper surface of the substrate W. Thereafter, the control device 4 successively opens the nitrogen gas valve 18 and the chemical solution valve 15, and allows the nitrogen gas nozzle 11 and the chemical solution nozzle 9 to discharge nitrogen gas and a chemical solution, respectively, while the substrate W is being rotated by the first spin chuck 8.

Nitrogen gas discharged from the nitrogen gas nozzle 11 flows outwardly between the lower surface of the covering member 10 and the upper surface of the substrate W. The chemical solution nozzle 9 located at the processing position discharges a chemical solution toward a portion of the peripheral portion of the upper surface of the substrate W. The control device 4 rotates the substrate W while discharging the chemical solution from the chemical solution nozzle 9. Therefore, the chemical solution discharged from the chemical solution nozzle 9 is supplied to the peripheral portion of the upper surface of the substrate W over the whole circumference. As a result, the chemical solution is supplied to the whole area of the peripheral portion of the upper surface of the substrate W. The chemical solution has high viscosity, and therefore the chemical solution supplied from the chemical solution nozzle 9 to the substrate W hardly moves from the solution-supplied position and stays at this position. Therefore, a state in which the chemical solution is held in the whole area of the peripheral portion of the upper surface of the substrate W is maintained. The peripheral portion of the upper surface of the substrate W is etched by contact with the chemical solution.

The control device 4 allows the nitrogen gas nozzle 11 to discharge nitrogen gas while a chemical solution is being discharged from the chemical solution nozzle 9. Therefore, the chemical solution has high volatility, and, even if gas of the chemical solution is generated between the chemical solution nozzle 9 and the substrate W, this gas is restrained or prevented from moving inwardly by nitrogen gas flowing outwardly. Especially near the chemical solution nozzle 9, the chemical solution and air are in contact with each other between the chemical solution nozzle 9 and the chemical solution held on the substrate W, in addition to the chemical solution held on the substrate W. Therefore, the area in which the chemical solution and air are in contact with each other near the chemical solution nozzle 9 is greater than in other regions, and chemical solution gas is generated more easily than in other regions. Therefore, the covering member 10 is disposed near the chemical solution nozzle 9, and nitrogen gas is supplied between the covering member 10 and the substrate W, and, as a result, a region inside the peripheral portion of the upper surface of the substrate W can be efficiently restrained or prevented from being exposed to the chemical solution gas.

When a predetermined period of time elapses after the nitrogen gas valve 18 and the chemical solution valve 15 have been opened, the control device 4 allows the nitrogen gas valve 18 and the chemical solution valve 15 to be closed, so that the chemical solution and the nitrogen gas stop being discharged. Furthermore, the control device 4 controls the spin motor 14, and allows the first spin chuck 8 to stop the rotation of the substrate W. Thereafter, the control device 4 allows the center robot CR to carry the substrate W held by the first spin chuck 8 out of the chemical solution supply unit 7a. Thereafter, the control device 4 allows the center robot CR to carry the substrate W carried out of the chemical solution supply unit 7a into the reaction unit 7b. The substrate W to which the chemical solution has been supplied is transferred from the chemical solution supply unit 7a to the reaction unit 7b in a horizontal posture. Accordingly, the substrate W is transferred from the chemical solution supply unit 7a to the reaction unit 7b in a state in which the chemical solution is held on the substrate W.

Thereafter, as shown in FIG. 7, a reaction process in which the reaction of the substrate W and the chemical solution to each other is promoted is performed in a state in which the chemical solution is held on the substrate W. Specifically, the control device 4 allows the center robot CR and any one of the substrate holding members 24 to horizontally hold the substrate W carried out of the chemical solution supply unit 7a. As a result, as shown in FIG. 7, the substrate W is horizontally held by the substrate holding member 24 in a state in which the chemical solution is held on the peripheral portion of the upper surface of the substrate W. The substrate W held on the substrate holding member 24 is held in the reaction unit 7b during a predetermined time. The reaction of the substrate W and the chemical solution to each other progresses during this predetermined time, and the peripheral portion of the upper surface of the substrate W is etched. Therefore, if foreign matters adhere to the peripheral portion of the upper surface of the substrate W, the foreign matters are lifted off from the substrate W along with a portion of the substrate W, or the chemical solution dissolves the foreign matters, so that the foreign matters are removed from the substrate W. The control device 4 may allow the heater 26 to heat the substrate W and the chemical solution held on the substrate W while the substrate W is being held in the reaction unit 7b. If the activity of the chemical solution becomes higher correspondingly to an increase in temperature, the processing time of the substrate W by use of the chemical solution can be shortened by heating the chemical solution and the substrate W. The ordinary processing time is 3 minutes to 12 hours, preferably 10 minutes to 2 hours, and the processing temperature is 15 to 100° C., preferably 20 to 60° C., depending on the kind of foreign matters and the degree of adhesion.

Only the carry-in operation of substrates W into the reaction unit 7b is performed at an initial step at which substrates W start being processed by the substrate processing apparatus 1. When the number of substrates W carried into the reaction unit 7b reaches a predetermined number of substrates W, i.e., reaches two or more, the control device 4 allows a plurality of substrates W to be carried out in order of arrival from a substrate W whose stay time in the reaction unit 7b has first arrived at a predetermined time. In other words, when the number of substrates W carried into the reaction unit 7b reaches a predetermined number, the control device 4 gives instructions to alternately and repeatedly perform a carry-in operation in which a single substrate W is carried into the reaction unit 7b by the center robot CR and a carry-out operation in which a single substrate W held in the reaction unit 7b during a predetermined time is carried out of the reaction unit 7b by the center robot CR. Thereafter, according to instructions given by the control device 4, the substrate W carried out of the reaction unit 7b is carried into the rinse unit 7c by the center robot CR. As a result, as shown in FIG. 7, the substrate W is placed on the third spin chuck 31. When the substrate W is placed on the third spin chuck 31, the control device 4 allows the rinsing liquid nozzle 32 to be located at the waiting position.

Thereafter, as shown in FIG. 7, a rinsing liquid (for example, deionized water) is supplied to the substrate W, and a rinsing process for rinsing away the chemical solution held on the peripheral portion of the upper surface of the substrate W is performed. Specifically, the control device 4 controls the spin motor 14, and allows the third spin chuck 31 to start rotating the substrate W. Thereafter, the control device 4 gives instructions to open the rinsing liquid valve 34 and to discharge a rinsing liquid from the rinsing liquid nozzle 32 toward a central portion of the upper surface of the substrate W while rotating the substrate W by the third spin chuck 31. The rinsing liquid discharged from the rinsing liquid nozzle 32 is supplied to the central portion of the upper surface of the substrate W, and spreads outwardly along the upper surface of the substrate W while receiving a centrifugal force produced by the rotation of the substrate W. As a result, the rinsing liquid is supplied to the whole area of the upper surface of the substrate W, and the chemical solution held on the peripheral portion of the upper surface of the substrate W is rinsed away. Furthermore, foreign matters that have lifted off from the peripheral portion of the upper surface of the substrate W along with a portion of the substrate W by the reaction of the substrate W and the chemical solution to each other or foreign matters dissolved by the chemical solution are rinsed away by the rinsing liquid. As a result, the foreign matters are removed from the substrate W, and the substrate W is cleaned. When a predetermined time elapses after the rinsing liquid valve 34 is opened, the control device 4 closes the rinsing liquid valve 34, and stops discharging the rinsing liquid from the rinsing liquid nozzle 32.

Thereafter, as shown in FIG. 7, spin drying for drying the substrate W is performed. Specifically, the control device 4 controls the spin motor 14, and rotates the substrate W at a high rotational speed (for example, several thousand revolutions per minute (rpm)). As a result, a great centrifugal force acts on the rinsing liquid adhering to the substrate W, and this rinsing liquid is shaken off outwardly from the substrate W. Therefore, the rinsing liquid is removed from the substrate W, and the substrate W is dried. After the spin drying is performed during a predetermined time, the control device 4 controls the spin motor 14, and stops the rotation of the substrate W by the third spin chuck 31. Thereafter, the control device 4 allows the center robot CR to carry the substrate W held by the third spin chuck 31 out of the rinse unit 7c.

After the substrate W is carried out of the rinse unit 7c, the control device 4 gives instructions to move the substrate W carried out of the rinse unit 7c from the center robot CR to the indexer robot IR. Thereafter, the control device 4 allows the indexer robot IR to carry the substrate W delivered to the indexer robot IR into the carrier C. A series of process steps performed by the substrate processing apparatus 1 are ended in this way. The control device 4 gives instructions to repeatedly perform the above-mentioned operations and to process a plurality of substrates W one by one.

As described above, in the first embodiment, a chemical solution containing an etching component and a thickening agent is supplied to a substrate W held by the first spin chuck 8 in the chemical solution supply unit 7a (first chamber 12). Thereafter, the substrate W is transferred by the center robot CR from the chemical solution supply unit 7a to the reaction unit 7b (second chamber 25) in a state in which the chemical solution is held on the substrate W. This operation is repeatedly performed, and a plurality of substrates W on each of which the chemical solution is held are carried into the reaction unit 7b. The substrates W carried into the reaction unit 7b are held on a plurality of substrate holding members 24, respectively, in a state of holding the chemical solution. The substrates W held on the substrate holding members 24, respectively, are carried out of the reaction unit 7b in order of arrival of a stay time in the reaction unit 7b at a predetermined time. The substrates W are processed without hindrance in this way.

The viscosity of a chemical solution supplied to the substrate W is increased by adding a thickening agent. In other words, the flowability of a chemical solution is lowered by adding a thickening agent. Therefore, a state in which the substrate W is covered with a chemical solution is maintained even if the chemical solution does not continue being supplied to the substrate W. Therefore, the consumption of the chemical solution can be reduced. Additionally, the amount of the chemical solution to be wasted can be reduced by reducing the consumption of the chemical solution. Additionally, an etching component is contained in the chemical solution, and therefore foreign matters, such as particles, adhering to a substrate W can be lifted off from the substrate W along with a portion of the substrate W, or foreign matters can be dissolved by the chemical solution. As a result, such foreign matters can be reliably removed from the substrate W. Additionally, the viscosity of the chemical solution is increased, and therefore the substrate W can be transferred in a state in which the chemical solution is held on the substrate W.

As mentioned above, the substrate W to which the chemical solution has been supplied by the chemical solution supply unit 7a is transferred from the chemical solution supply unit 7a to the reaction unit 7b in a state of holding the chemical solution, and is held in the reaction unit 7b during a predetermined time in a state of holding the chemical solution. Therefore, a period of time during which the substrate W and the chemical solution react to each other is secured sufficiently. Additionally, the reaction of the substrate W and the chemical solution to each other is also performed outside the chemical solution supply unit 7a, and therefore the chemical solution can be supplied to a subsequent substrate W by the chemical solution supply unit 7a during the progression of the reaction of the substrate W and the chemical solution to each other. Therefore, a decrease in throughput (i.e., the number of substrates W to be processed per unit time) can be restrained or prevented.

In the first embodiment, a substrate W held in the reaction unit 7b during a predetermined time is transferred from the reaction unit 7b to the rinse unit 7c by the center robot CR. In other words, a substrate W that has satisfactorily reacted to a chemical solution in the reaction unit 7b is carried into the rinse unit 7c. Thereafter, a rinsing liquid is supplied to the substrate W held by the third spin chuck 31 in the rinse unit 7c. As a result, the chemical solution held on the substrate W is rinsed away by the rinsing liquid. As mentioned above, the supply of the chemical solution, the reaction of the substrate W and the chemical solution to each other, and the removal of the chemical solution are performed in the different chambers, and therefore the structure in each of the chambers 12, 25, and 33 can be restrained or prevented from being complicated.

Additionally, in the first embodiment, the chemical solution is partially supplied to the upper surface of the substrate W. In more detail, the chemical solution is supplied to the peripheral portion of the upper surface of the substrate W. Therefore, in this case, the consumption of the chemical solution can be made smaller than in a case in which the chemical solution is supplied to the whole area of the upper surface of the substrate W. Additionally, the region into which the chemical solution is supplied is predetermined, and therefore the position to which the chemical solution is supplied is not required to be changed for each substrate W. Additionally, the chemical solution is not supplied to a place beyond the predetermined region, and therefore a region that has no need for the supply of the chemical solution can be restrained or prevented from being damaged by the chemical solution. Additionally, the chemical solution has high viscosity, and therefore splashes of the chemical solution caused when the chemical solution is supplied to the substrate W are restrained. As a result, the chemical solution can be reliably restrained or prevented from being supplied to a region other than a desired region.

Second Embodiment

Next, a second embodiment of the present invention will be described.

Figure 8:
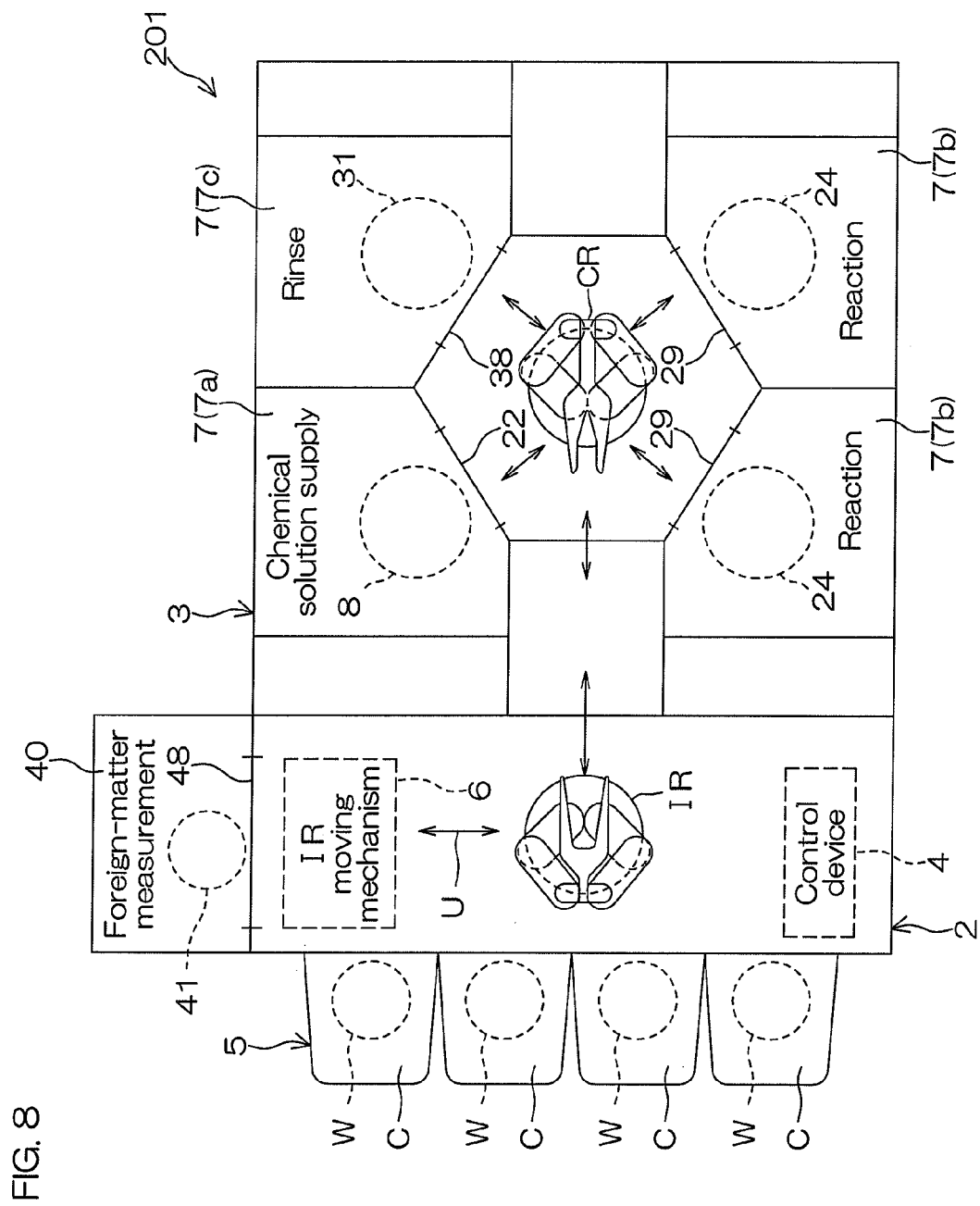
FIG. 8 is a illustrated plan view showing a layout of a substrate processing apparatus according to a second embodiment of the present invention.
Figure 9:
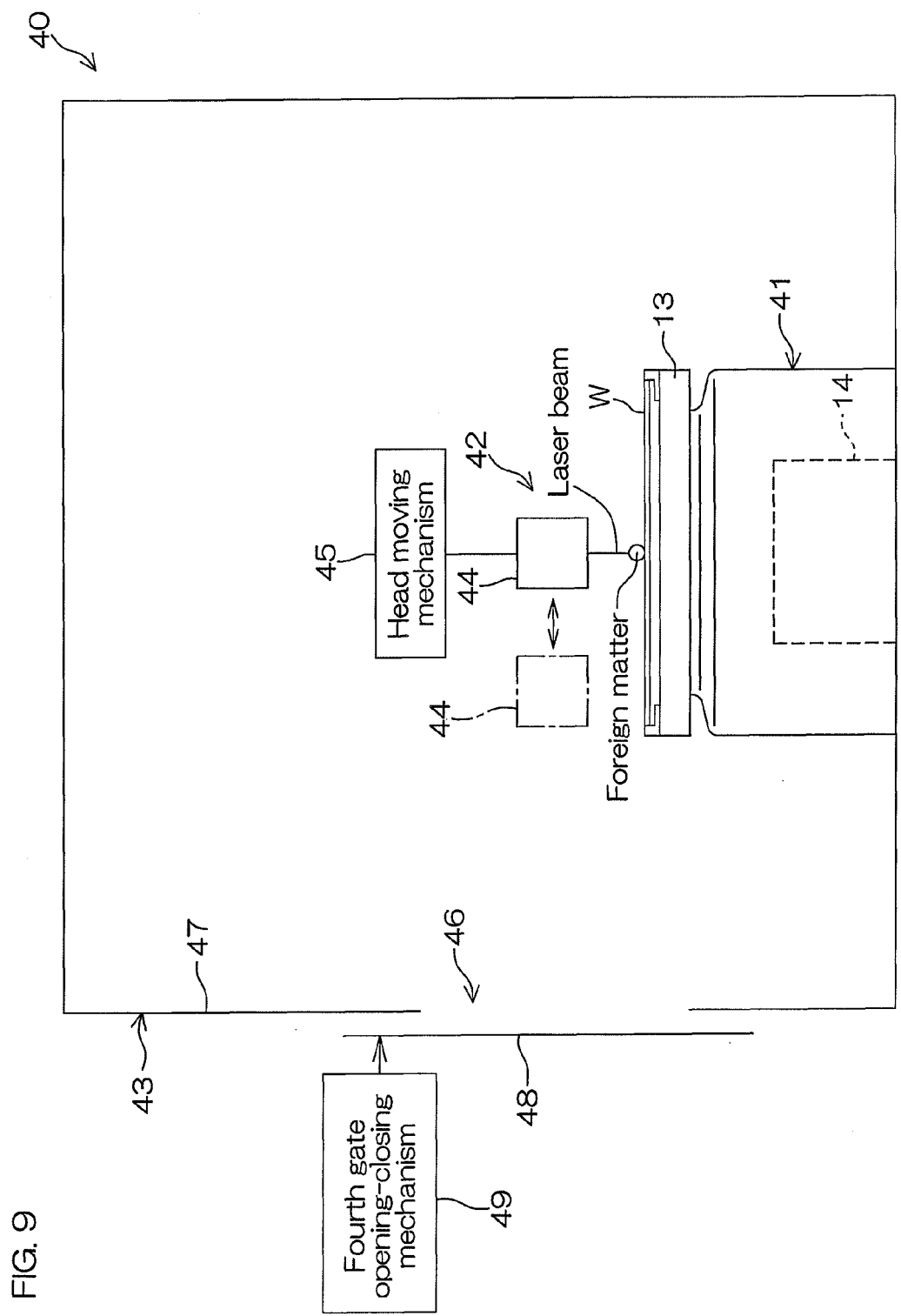
FIG. 9 is a schematic side view showing a structure of a foreign-matter measuring unit according to the second embodiment of the present invention.

A main difference between this second embodiment and the first embodiment mentioned above is that a foreign-matter measuring unit 40 that measures the position of foreign matters adhering to a substrate W is provided in a substrate processing apparatus 201. Additionally, a chemical solution is supplied into a region determined for each substrate W (i.e., a region in which foreign matters are contained) in the second embodiment, whereas a chemical solution is supplied into a predetermined region (i.e., the peripheral portion of the upper surface of a substrate W) in the first embodiment. In FIG. 8 to FIG. 10, the same reference character as in FIG. 1 and in the other figures is given to a component equivalent to that of FIG. 1 to FIG. 7, and a description of the component equivalent thereto is omitted.

FIG. 8 is a illustrated plan view showing a layout of the substrate processing apparatus 201 according to the second embodiment of the present invention. FIG. 9 is a schematic side view showing a structure of the foreign-matter measuring unit 40 according to the second embodiment of the present invention.

The substrate processing apparatus 201 according to the second embodiment includes the foreign-matter measuring unit 40 that measures the position of foreign matters adhering to a substrate W in addition to the structure of the substrate processing apparatus 1 according to the first embodiment. As shown in FIG. 8, in the second embodiment, the foreign-matter measuring unit 40 is disposed at a position that is accessible by the indexer robot IR. The indexer robot IR performs a carry-in operation for carrying substrates W into the foreign-matter measuring unit 40 and a carry-out operation for carrying substrates W out of the foreign-matter measuring unit 40. Additionally, the indexer robot IR transfers substrates W between the carrier C held by the carrier holding section 5 and the foreign-matter measuring unit 40, and transfers substrates W between the foreign-matter measuring unit 40 and the center robot CR.

As shown in FIG. 9, the foreign-matter measuring unit 40 includes a fourth spin chuck 41 that horizontally holds and rotates a substrate W, a foreign-matter measuring device 42 (foreign-matter measuring unit) that measures the presence or absence of foreign matters and measures the position of foreign matters, and a fourth chamber 43 (measuring chamber) that contains the fourth spin chuck 41.

The fourth spin chuck 41 includes a disk-shaped spin base 13 that is rotatable around a vertical axis passing through the center of a substrate W while horizontally holding the substrate W and a spin motor 14 that rotates the spin base 13 around the vertical axis. The fourth spin chuck 41 may be a gripping-type chuck, or may be a vacuum-type chuck. In the second embodiment, the fourth spin chuck 41 is a gripping-type chuck.

The foreign-matter measuring device 42 measures whether there are foreign matters on the upper surface of the substrate W, and measures the position of foreign matters with respect to the substrate W. A device including at least one of, for example, a particle counter, a total reflection X-ray fluorescence analyzer (TRXRF), an energy dispersive X-ray spectrometer (EDX), a scanning electron microscope (SEM), and an image recognition foreign-matter inspection device can be mentioned as the foreign-matter measuring device 42. In the second embodiment, the foreign-matter measuring device 42 is a device that detects the presence or absence of foreign matters and detects the position of foreign matters by use of a laser beam.

The foreign-matter measuring device 42 includes an irradiation head 44 that emits a laser beam and a head moving mechanism 45 that moves the irradiation head 44. The irradiation head 44 is disposed in the fourth chamber 43. The head moving mechanism 45 moves the irradiation head 44 so that a laser beam emitted from the irradiation head 44 moves between the center of the upper surface of the substrate W and the outer peripheral portion of the upper surface of the substrate W. The control device 4 controls the spin motor 14 and the foreign-matter measuring device 42, and moves the irradiation head 44 so that a laser beam emitted from the irradiation head 44 moves between the center of the upper surface of the substrate W and the outer peripheral portion of the upper surface of the substrate W while causing the fourth spin chuck 41 rotate the substrate W. As a result, the whole area of the upper surface of the substrate W is scanned with a laser beam, and is irradiated with the laser beam emitted from the irradiation head 44.

The foreign-matter measuring device 42 detects the presence or absence of foreign matters on the substrate W by radiating a laser beam to the upper surface of the substrate W. Additionally, the foreign-matter measuring device 42 measures the position of foreign matters detected from the movement amount of the irradiation head 44 moved by the head moving mechanism 45 and from the rotational angle of the substrate W. In more detail, based on the movement amount of the irradiation head 44 moved by the head moving mechanism 45, the foreign-matter measuring device 42 measures the distance from the center of the upper surface of the substrate W to foreign matters. Additionally, the foreign-matter measuring device 42 obtains the rotational angle of the substrate W (angle information) that is based on a notch or an orientation flat provided at the peripheral portion of the substrate W from the control device 4. The foreign-matter measuring device 42 measures the position of foreign matters from the distance from the center of the upper surface of the substrate W to the foreign matters and from the rotational angle of the substrate W. Thereafter, the foreign-matter measuring device 42 outputs the position of the foreign matters to the control device 4 as positional information.

When a chemical solution is supplied to the substrate W in the chemical solution supply unit 7a, the control device 4 controls the nozzle moving mechanism 17 (see FIG. 2), and gives instructions to supply a chemical solution into a region that contains foreign matters based on the positional information obtained from the foreign-matter measuring device 42. In other words, the control device 4 gives instructions to supply a chemical solution into a region determined for each substrate W (range in which foreign matters are contained), not to supply a chemical solution into a predetermined region (i.e., to the peripheral portion of the upper surface of the substrate W) as in the first embodiment. Therefore, the processing position of the chemical solution nozzle 9 (see FIG. 2) in the second embodiment is not a fixed position but a fixed region in which a chemical solution discharged from the chemical solution nozzle 9 is supplied to any position on the upper surface of the substrate W.

The fourth chamber 43 includes a fourth partition wall 47 having a fourth opening 46 and a fourth gate shutter 48 with which the fourth opening 46 is covered. The fourth gate shutter 48 is disposed outside the fourth partition wall 47. The fourth gate opening-closing mechanism 49 is connected to the fourth gate shutter 48. The fourth gate opening-closing mechanism 49 moves the fourth gate shutter 48 between a closed position at which the fourth opening 46 is closed by the fourth gate shutter 48 and an open position at which the fourth opening 46 is opened. The fourth gate shutter 48 is beforehand placed at the open position when the substrate W is carried into the fourth chamber 43 or when the substrate W is carried out of the fourth chamber 43. The substrate W is carried into and out of the fourth chamber 43 in a state in which the fourth opening 46 is opened. Thereafter, the fourth gate shutter 48 is placed at the closed position, and the fourth opening 46 is closed by the fourth gate shutter 48.

FIG. 10 is a view for describing one example of processing the substrate W performed by the substrate processing apparatus 201 according to the second embodiment of the present invention. Hereinafter, reference is made to FIG. 8 and FIG. 10.

The control device 4 allows the indexer robot IR to carry out unprocessed substrates W contained in the carrier C. Thereafter, the control device 4 allows the indexer robot IR to carry the substrates W carried out of the carrier C into the foreign-matter measuring unit 40. As a result, the substrate W is placed on the fourth spin chuck 41. When the substrate W is placed on the fourth spin chuck 41, the control device 4 allows the irradiation head 44 to recede from above the fourth spin chuck 41.

As shown in FIG. 10, in the foreign-matter measuring unit 40, the control device 4 allows the foreign-matter measuring device 42 to irradiate the substrate W with a laser beam while causing the fourth spin chuck 41 rotate the substrate W as described above (foreign-matter measuring process). As a result, the position of foreign matters on the substrate W is measured, and positional information about the foreign matters is output from the foreign-matter measuring device 42 to the control device 4. After the position of the foreign matters is measured, the control device 4 allows the indexer robot IR to carry the substrate W out of the foreign-matter measuring unit 40. The substrate W carried out of the foreign-matter measuring unit 40 is delivered from the indexer robot IR to the center robot CR. The center robot CR carries the substrate W received from the indexer robot IR into the chemical solution supply unit 7a.

As shown in FIG. 10, in the chemical solution supply unit 7a, a chemical solution discharged from the chemical solution nozzle 9 is supplied to a portion (i.e., a region in which foreign matters are contained) of the upper surface of the substrate W (chemical solution supply process). The chemical solution has high viscosity, and therefore the chemical solution supplied from the chemical solution nozzle 9 to the substrate W hardly moves from the solution-supplied position and stays at this position. Therefore, a state in which the chemical solution is held at the portion of the upper surface of the substrate W is maintained. The portion (region in which foreign matters are contained) of the upper surface of the substrate W is etched by contact with the chemical solution. After the chemical solution is supplied to the substrate W, the substrate W placed in the chemical solution supply unit 7a is carried out of the chemical solution supply unit 7a by the center robot CR. Furthermore, the substrate W carried out of the chemical solution supply unit 7a is carried into the reaction unit 7b by the center robot CR.

As shown in FIG. 10, in the reaction unit 7b, after a plurality of substrates W are carried in, a carry-in operation in which a single substrate W is carried into the reaction unit 7b and a carry-out operation in which a single substrate W is carried out of the reaction unit 7b are alternately and repeatedly performed in the same manner as in the first embodiment. The substrate W held by the substrate holding member 24 is held in the reaction unit 7b during a predetermined time, and, as a result, the reaction of the substrate W and the chemical solution to each other progresses, and the portion (region in which foreign matters are contained) of the upper surface of the substrate W is etched (reaction process). Accordingly, the foreign matters are lifted off from the substrate W along with the portion of the upper surface of the substrate W, or are dissolved by the chemical solution. The substrate W held in the reaction unit 7b during the predetermined time is carried out of the reaction unit 7b by the center robot CR. Thereafter, the substrate W carried out of the reaction unit 7b is carried into the rinse unit 7c by the center robot CR.

As shown in FIG. 10, in the rinse unit 7c, a rinsing liquid is discharged from the rinsing liquid nozzle 32 toward the central portion of the upper surface of the substrate W held by the third spin chuck 31 in the same manner as in the first embodiment. As a result, the rinsing liquid is supplied to the whole area of the upper surface of the substrate W, and the chemical solution held on the upper surface of the substrate W is rinsed away (rinsing process). Furthermore, foreign matters lifted off from the upper surface of the substrate W along with a portion of the substrate W by the reaction of the substrate W and the chemical solution to each other or foreign matters dissolved by the chemical solution are rinsed away by the rinsing liquid. As a result, the foreign matters are removed from the substrate W, and the substrate W is cleaned. Thereafter, as shown in FIG. 10, the rinsing liquid adhering to the substrate W is removed from the substrate W by the high-speed rotation of the substrate W, and the substrate W is dried (spin drying process).

After the spin drying process is performed in the rinse unit 7c, the substrate W is carried out of the rinse unit 7c by the center robot CR. Thereafter, the substrate W carried out of the rinse unit 7c is delivered from the center robot CR to the indexer robot IR. The indexer robot IR carries the already-processed substrate W received from the center robot CR into the carrier C held by the carrier holding section 5. Thereby, the series of process steps performed by the substrate processing apparatus 201 are ended. The control device 4 gives instructions to repeatedly perform these operations and to process the plurality of substrates W one by one.

As described above, in the second embodiment, the position of foreign matters adhering to the substrate W is measured by the foreign-matter measuring device 42, and a chemical solution is supplied into a region in which foreign matters are contained. Therefore, a chemical solution is reliably supplied into a region in which foreign matters are contained, and foreign matters adhering to the substrate W are reliably removed. Additionally, a chemical solution is supplied only into a region in which foreign matters are contained, and therefore a region that has no need for the supply of a chemical solution can be restrained or prevented from being damaged by the chemical solution.

Additionally, in the second embodiment, foreign matters are measured by the foreign-matter measuring device 42 in the fourth chamber 43. In other words, the measurement of foreign matters by the foreign-matter measuring device 42 is performed in a place differing from the first chamber 12, the second chamber 25, and the third chamber 33. Therefore, the structure in each of the chambers 12, 25, 33, and 43 can be restrained or prevented from being complicated.

Other Embodiments

Although the first and second embodiments of the present invention have been described as above, the present invention is not limited to the contents of the first and second embodiments, and can be variously modified within the scope of the appended claims.

For example, the chemical solution supply unit 7a may include a plurality of chemical solution nozzles 9 although the chemical solution supply unit 7a includes the single chemical solution nozzle 9 in the first and second embodiments as described above.

Additionally, the chemical solution supply unit 7a is not necessarily required to include the covering member 10 although the chemical solution supply unit 7a includes the covering member 10 in the first and second embodiments as described above.

Additionally, a chemical solution may be supplied to the whole area of the upper surface of the substrate W although a chemical solution is partially supplied to the upper surface of the substrate W in the first and second embodiments as described above. Additionally, a chemical solution may be supplied to the peripheral end surface of the substrate W and/or to the lower surface of the substrate W without being limited to only the upper surface of the substrate W.

Additionally, processing of the substrate W may be processing other than the processing for removing foreign matters although foreign matters, such as particles, adhering to the substrate W are removed from the substrate W by supplying a chemical solution to the substrate W in the first and second embodiments as described above. For example, an etching process that is performed to remove a thin film formed on the front surface of the substrate W by use of a chemical solution may be performed for the substrate W.

Additionally, the foreign-matter measuring unit 40 may be disposed at a position accessible by the center robot CR although the foreign-matter measuring unit 40 is disposed at a position accessible by the indexer robot IR in the second embodiment as described above. Specifically, at least one processing unit 7 of a plurality of processing units 7 may be the foreign-matter measuring unit 40.

Additionally, the foreign-matter measuring device 42 may be arranged to measure the position of foreign matters in the chemical solution supply unit 7a (first chamber 12) although the foreign-matter measuring device 42 measures the position of foreign matters in the foreign-matter measuring unit 40 (fourth chamber 43) in the second embodiment as described above. In other words, the foreign-matter measuring unit 40 may not be provided, and the chemical solution supply unit 7a may additionally include the foreign-matter measuring device 42. In this case, the substrate W is not necessarily required to be transferred from the carrier C to the foreign-matter measuring unit 40 and be transferred from the foreign-matter measuring unit 40 to the chemical solution supply unit 7a, and therefore time taken to transfer the substrate W can be shortened. Therefore, throughput can be increased.

Additionally, the substrate processing apparatuses 1 and 201 may be apparatuses for processing a polygonal substrate, such as a glass substrate for a liquid crystal display device, although the substrate processing apparatuses 1 and 201 are apparatuses for processing a circular substrate W, such as a semiconductor wafer, in the first and second embodiments as described above.

Although the embodiments of the present invention have been described in detail, these embodiments are merely concrete examples used to clarify the technical contents of the present invention, and the present invention should not be understood by being limited to these concrete examples, and the spirit and scope of the present invention are limited solely by the appended claims.

The present application corresponds to Japanese Patent Application No. 2011-048113 filed in the Japan Patent Office on Mar. 4, 2011, and the entire disclosure of the application is incorporated herein by reference.

What is claimed is:

1. A substrate processing method comprising:
a chemical solution supply step of supplying a chemical solution containing an etching component and a thickening agent to a substrate held by a first substrate holding unit in a first processing chamber and allowing the substrate to hold the chemical solution to begin a reaction between the substrate and the chemical solution in the first processing chamber;
a first transfer step after the chemical solution supply step is performed, comprising transferring each of a plurality of said substrates from the first processing chamber to a second processing chamber by a substrate transfer unit in a state in which the chemical solution is held on each of the plurality of substrates to continue said reaction, and allowing a second substrate holding unit to hold the plurality of substrates in the second processing chamber in a state in which the chemical solution is still held on each of the plurality of substrates;
a reaction processing step in said second processing chamber of promoting said reaction between the substrates and the chemical solution, after the first transfer step is performed; and
a second transfer step of transferring each of the plurality of substrates from the second processing chamber to a third processing chamber by the substrate transfer unit after the first transfer step is performed.

2. The substrate processing method according to claim 1, wherein
the etching component is a mixture of hydrofluoric acid and hydrogen peroxide or a mixture of ammonium hydroxide and hydrogen peroxide, and
the thickening agent is one or more selected from methylcellulose, carboxymethyl cellulose, polyethylene glycol, sodium polyacrylate, and polyvinyl alcohol.

3. The substrate processing method according to claim 1, further comprising a rinsing liquid supply step of supplying a rinsing liquid to the substrate held by a third substrate holding unit in the third processing chamber.

4. The substrate processing method according to claim 1, wherein the substrate has two opposed major surfaces and an edge surface therebetween, and
the chemical solution supply step includes a step of supplying the chemical solution to one of said major surfaces of the substrate.

5. The substrate processing method according to claim 4, further comprising a foreign-matter detecting step of detecting a position on said major surface of foreign matter adhering to said major surface of the substrate,
wherein the chemical solution supply step includes a step of supplying the chemical solution into a region in which the foreign matter is adhering to the major surface.

6. The substrate processing method according to claim 5, further comprising a third transfer step of transferring the substrate from a detecting chamber, in which the position of the foreign matter adhering to the substrate is detected, to the first processing chamber by the substrate transfer unit.

7. The substrate processing method according to claim 4, wherein the chemical solution supply step includes a step of supplying the chemical solution into a predetermined partial region of the major surface.

8. A substrate processing method comprising:
a chemical solution supply step of supplying a chemical solution containing an etching component and a thickening agent to a substrate in a first processing chamber and allowing the substrate to hold the chemical solution to begin a reaction between the substance and the chemical solution in the first processing chamber;
a transfer step after the chemical solution supply step is performed, comprising transferring each of a plurality of said substrates from the first processing chamber to a second processing chamber by a substrate transfer unit in a state in which the chemical solution is held on each of the plurality of substrates to continue said reaction, and allowing a second substrate holding unit to hold the plurality of substrates in the second processing chamber in a state in which the chemical solution is still held on each of the plurality of substrates;
a reaction processing step in said second processing chamber of promoting said reaction between the substrates and the chemical solution, after the transfer step is performed; and a carry-out step of carrying the plurality of substrates out of the second processing chamber in order of arrival in the second processing chamber at a predetermined time after the transfer step is performed.

* * * * *